United States Patent
Gardner et al.

(10) Patent No.: US 6,180,987 B1
(45) Date of Patent: Jan. 30, 2001

(54) INTEGRATED CIRCUIT TRANSISTOR WITH LOW-RESISTIVITY SOURCE/DRAIN STRUCTURES AT LEAST PARTIALLY RECESSED WITHIN A DIELECTRIC BASE LAYER

(75) Inventors: Mark I. Gardner, Cedar Creek; H. Jim Fulford, Jr., Austin, both of TX (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/248,433

(22) Filed: Feb. 11, 1999

(51) Int. Cl.[7] ..................................... H01L 29/72
(52) U.S. Cl. ................. 257/401; 257/343; 257/345; 257/474; 257/762; 257/902
(58) Field of Search ................. 257/401, 345, 257/474, 343, 762, 902

(56) References Cited

U.S. PATENT DOCUMENTS

| | | |
|---|---|---|
| 4,665,414 * | 5/1987 | Koeneke et al. ............. 257/902 |
| 5,168,072 | 12/1992 | Moslehi . |
| 5,319,237 * | 6/1994 | Legros .................. 257/902 |
| 5,428,234 * | 6/1995 | Sumi ..................... 257/902 |
| 5,504,031 | 4/1996 | Hsu et al. . |
| 5,773,358 | 6/1998 | Wu et al. . |
| 5,994,727 * | 11/1999 | Lee ..................... 257/902 |

* cited by examiner

Primary Examiner—Edward Wojciechowicz
(74) Attorney, Agent, or Firm—Kevin L. Daffer; Conley, Rose & Tayon (57) ABSTRACT

A method for fabricating an integrated circuit is presented. In the method, a substrate is provided having a dielectric base layer formed thereupon. Source/drain trenches may be formed in the dielectric base layer. Source/drain structures containing metal may then be formed within the source/drain trenches. The upper surface of the dielectric base layer is then recessed a recession depth below upper surfaces of the source/drain structures. A gate trench is thus defined between upper portions of the source/drain structures extending above the upper surface of the dielectric base layer. A conductive channel layer is subsequently formed at least partially within the gate trench. A gate conductive layer may then be formed above the conductive channel layer and at least partially within the gate trench.

13 Claims, 6 Drawing Sheets

INTEGRATED CIRCUIT TRANSISTOR WITH LOW-RESISTIVITY SOURCE/DRAIN STRUCTURES AT LEAST PARTIALLY RECESSED WITHIN A DIELECTRIC BASE LAYER

BACKGROUND OF THE INVENTION

1. Field of the Invention

This invention relates to integrated circuit fabrication and, more particularly, to a method for fabricating an integrated circuit that includes a transistor with low-resistivity junctions (i.e., source/drain structures) at least partially recessed within a dielectric base layer, and to an integrated circuit capable of being manufactured by such a method.

2. Description of the Related Art

Advances in computer technology, among other factors, result in a continual demand for faster integrated circuits. Integrated circuit speed may be limited by various factors, such as circuit architecture, interconnection delays, and speed limitations of individual transistors. Such transistor speed limitations may often be described in terms of RC time constants, where R and C are the resistance and capacitance, respectively, associated with the transistor structure. RC time constants characterize the time needed for a transistor to turn on or off, so that transistor speed may be increased by making RC time constants as low as possible. Two types of resistance commonly associated with transistor structures are series resistance and contact resistance. Series resistance is the resistance encountered by carriers traveling within a given portion of the transistor, such as the source of a MOSFET. Contact resistance is the resistance associated with a contact to the transistor region.

Figure 1:
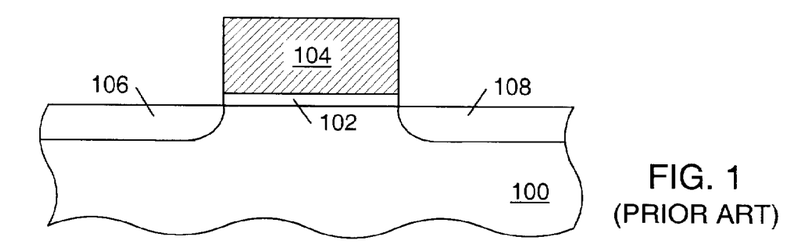
FIG. 1 is a partial cross-sectional view of a silicon substrate including a self-aligned transistor formed using a conventional process.

Both series and contact resistance are associated with source, drain, and gate regions of MOS transistors. Series resistance is related to the resistivity of the doped silicon typically used for source, drain and gate regions, while contact resistance is related to the resistance of the junction formed between such a silicon source, drain or gate region and an interconnect, which is typically formed from metal. A partial cross-sectional view of a conventional MOSFET structure is shown in FIG. 1. Gate dielectric 102 and polysilicon gate conductor 104 are formed upon silicon substrate 100 by deposition and patterning of dielectric and polysilicon layers. Source 106 and drain 108 are of an opposite carrier type than substrate 100. No patterning step is needed for introduction of source 106 and drain 108, since these impurity distributions are typically introduced after formation of gate conductor 104. Gate conductor 104 serves as a mask to exclude the dopants forming source 106 and drain 108 from the transistor channel underlying gate dielectric 102. Because photolithography and the associated alignment process is not used in forming source 106 and drain 108, the source and drain are said to be "self-aligned" to the gate. The transistor and the fabrication method used to form it are also often described as self-aligned.

Self-aligned source/drain regions such as regions 106 and 108 in FIG. 1 exhibit minimal overlap with the transistor gate, minimizing the parasitic capacitances that can increase RC time constants and limit high-frequency transistor performance. In addition, the self-alignment process allows smaller feature sizes to be used, because the size tolerances that must be left to allow for lithographic alignment error are not needed. The use of conventional self-aligned processes does impose limitations upon transistor fabrication, however. For example, the use of impurity regions in the semiconductor substrate to form the source and drain necessitates high-temperature (greater than about 900° C.) processing to activate impurities and anneal substrate damage, if the source and drain impurities are introduced by ion implantation (as is generally the case). Alternative impurity introduction methods such as diffusion also involve high-temperature processes.

The choice of gate materials is therefore limited, because the gate must be able to withstand the high-temperature source/drain processing. Metals such as aluminum, which might otherwise be attractive because of their low resistivity, are not able to withstand such high temperatures. In part for this reason, the current material of choice for gate conductors in MOSFET fabrication is polycrystalline silicon, or polysilicon. The resistivity of a polysilicon gate conductor is typically lowered by doping, which is often performed by ion implantation, using the same implants that dope the self-aligned source and drain.

Problems can arise with this doping, however, in part because of the different rates of dopant diffusion in polysilicon as opposed to single-crystal silicon. Although typical gate conductor thicknesses are greater than the depths of the shallow junctions required for source and drain regions in high-performance devices, diffusion rates along the grain boundaries of polycrystalline films can be on the order of one hundred times as fast as in single-crystal silicon. This can allow dopants in a polysilicon gate conductor to diffuse across the thin gate dielectric and into the underlying channel region during high-temperature processes such as implant anneals. Such diffusion can leave a region of low carrier concentration in the polysilicon directly above the gate dielectric, an occurrence often called the "polysilicon depletion effect". This region of the gate conductor adjacent to the gate dielectric therefore has a higher resistivity, and the resulting device performs as if it had an increased gate dielectric thickness. Effective doping of polysilicon gate regions is further complicated in CMOS devices because of differences in the diffusion behavior of boron, the typical p-channel transistor dopant, and arsenic, the typical n-channel transistor dopant. Boron diffuses more rapidly in polysilicon than arsenic, which tends to segregate at grain boundaries. Adequate activation of arsenic impurities throughout the gate conductor of an n-channel device without causing excessive boron diffusion and polysilicon depletion effects in a p-channel device presents significant challenges.

It would therefore be desirable to design a method for fabricating a transistor that did not require dopant implantation into a silicon substrate and the associated high-temperature processing. The desired method should also provide for the formation of low-resistivity source/drain regions and low-resistivity contacts to the source/drain regions and the gate conductor. A transistor formed in such a manner could have lower series and contact resistances than conventionally formed transistors.

SUMMARY OF THE INVENTION

The problems described above are in large part addressed by the method for fabricating an integrated circuit presented herein. In the present method, a substrate is provided having a dielectric base layer arranged thereupon. Source/drain trenches may be formed in the dielectric base layer. Source/drain structures, which contain metal, may then be formed within the source/drain trenches. The upper surface of the dielectric base layer may be etched back to recess its resulting upper surfaces below an upper surface of the source/drain structures. A gate trench is thus defined between upper portions of the source/drain structures extending above the upper surface of the dielectric base layer. A conductive channel layer is subsequently formed at least partially within the gate trench. A gate conductive layer may then be formed above the conductive channel layer and at least partially within the gate trench. Portions of the gate conductive layer can then be planarized to form a gate conductor at least partially arranged within the gate trench.

An integrated circuit formed in the manner described preferably utilizes low-resistivity source/drain structures that are at least partially recessed in a dielectric base layer. The source/drain structures may be composed of low-resistivity metals such as aluminum or copper. These structures can be formed without the use of high temperature processing, allowing for the use of similar metals as a gate conductor if desired. The materials and structures described herein thus provide for the formation of a transistor having lower series and contact resistances than conventionally formed transistors.

In an embodiment, the source/drain trenches are preferably formed in the dielectric base layer using a combination of photolithography and anisotropic etching that allows the formation of narrow trenches (e.g., preferably as wide as the minimum resolvable feature size of the equipment used) having substantially vertical sidewalls. Etching to form the source/drain trenches is preferably terminated before the substrate is reached to ensure that sufficient isolation exists between the source/drain trenches and the substrate. A source/drain conductive layer, which preferably is composed of metal, may then be deposited over the dielectric base layer such that the source/drain conductive layer substantially fills the source/drain trenches. The portions of the source/drain conductive layer extending above the upper surface of the dielectric base layer may be removed, preferably by polishing. Consequently, source/drain structures may be formed that are substantially contained within the source/drain trenches.

The upper surface of the dielectric base layer may subsequently be recessed a recession depth below the upper surfaces of the source/drain structures. As a result of this process, upper portions of the source/drain structures may extend above the dielectric base layer. A gate trench is defined between the upper portion of the source/drain structures. The subsequently formed gate conductor, gate dielectric, and conductive channel will all preferably be at least partially arranged within the gate trench.

After the recession process is complete, spacers may be formed upon sidewall portions of the upper portions of the source/drain structures. Spacers may be formed by depositing a spacer dielectric layer and then anisotropically etching the layer such that the spacers remain upon the source/drain structure sidewalls. Etching of the spacers preferably is performed until the uppermost surfaces of the spacers are substantially elevationally below the upper surfaces of the source/drain structures. This "over-etching" of the spacers preferably results in upper sidewall portions of the source/drain structures being exposed.

A channel conductive layer may then be deposited over the source/drain structures and at least partially within the gate trench. Deposition of the channel conductive layer may involve depositing polysilicon, but could also involve the deposition of a metal. Dopants may be later introduced into the channel conductive layer as part of a threshold adjust step.

A gate dielectric layer may then be formed upon the channel conductive layer and a gate conductive layer formed upon the gate dielectric layer. The gate conductive layer may be composed of polysilicon or a metal such as copper or aluminum. Portions of the gate conductive layer can then be planarized to form a gate conductor from the gate conductive layer that is at least partially arranged within the trench. Planarization may be further carried out upon portions of the gate conductive layer, gate dielectric layer, and channel conductive layer until a gate dielectric and a conductive channel are formed that are also at least partially arranged within the gate trench.

An integrated circuit is also presented. The integrated circuit preferably includes a dielectric base layer arranged upon a substrate. Source/drain trenches are defined within the dielectric base layer. Source/drain structures, preferably containing metal, may be arranged at least partially within the source/drain trenches. A gate trench is defined between upper portions of the source/drain structures extending above the upper surface of the dielectric base layer. A conductive channel is preferably at least partially arranged within the gate trench and extends between the upper portions of the gate structures.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
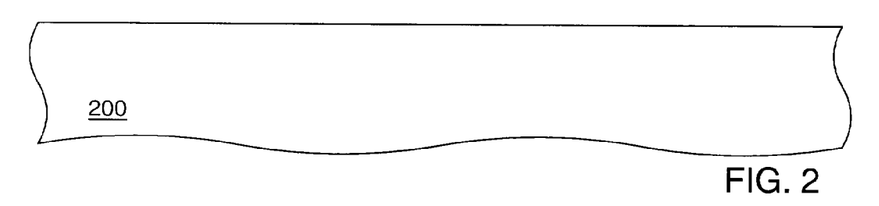
FIG. 2 is a partial cross-sectional view of a semiconductor topography, wherein a substrate is shown.

FIG. 2 depicts a partial cross-sectional view of a semiconductor topography in which substrate 200 is shown. Substrate 200 is preferably composed of a semiconducting material such as lightly-doped, single crystal silicon.

Figure 3:
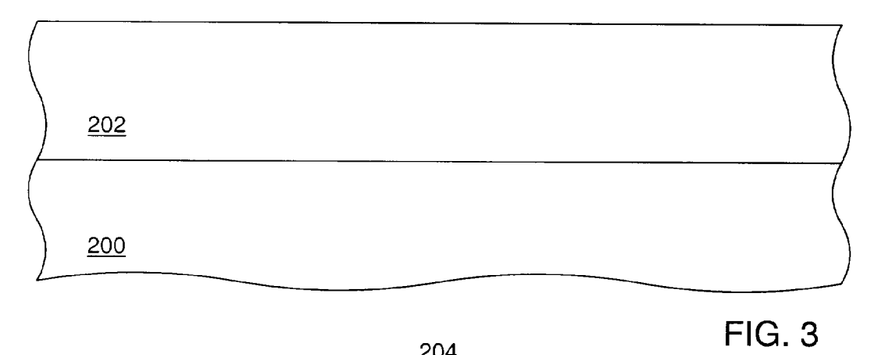
FIG. 3 is a partial cross-sectional view of the semiconductor topography, wherein a dielectric base layer is formed upon the substrate according to a processing step subsequent to FIG. 2.

FIG. 3 illustrates a processing step in which dielectric base layer 202 is formed upon substrate 200. Suitable materials for dielectric base layer 202 include silicon dioxide, silicon nitride, and silicon oxynitride. (As recited herein, silicon oxynitride refers to dielectrics formed from silicon, oxygen, and nitrogen and includes, for example, nitrided oxides.) Dielectric base layer 202 is preferably deposited using chemical vapor deposition ("CVD") techniques. Suitable deposition methods for dielectric base layer 202 include low-pressure CVD ("LPCVD"), plasma-enhanced CVD ("PECVD"), and atmospheric-pressure CVD ("APCVD"). In embodiments in which dielectric base layer 202 is composed of silicon nitride, a thin pad layer of silicon dioxide may be grown or deposited between dielectric base layer 202 and substrate 200. Low k value materials (i.e., materials having a k value less than 3.5) may also be used for dielectric base layer 202, including: fluorine-doped silicon oxide ("FSG"), low k spin-on glasses (e.g., hydrogen silsesquioxane and methyl silsesquioxane), polymers (e.g., polyimide and parylene), and porous gels or foams. Some of these materials, such as FSG, may be deposited by CVD methods, while others, such as spin-on glasses and polymers, are typically spun on. Whatever formation techniques are used, dielectric base layer 202 is preferably about 3000–7000 angstroms thick after formation is complete.

Active devices, such as MOS transistors, may be formed within and upon substrate 200 and below dielectric base layer 202 in processing steps prior to FIG. 3. In such a case, dielectric base layer 202 may be formed by depositing a dielectric layer over the substrate and then planarizing the upper surface of the dielectric layer. Dielectric base layer 202 is preferably sufficiently thick to electrically isolate any devices formed in the substrate plane (i.e., within, upon, and just above the substrate) from devices formed above the dielectric base layer in subsequent processing.

Figure 4:
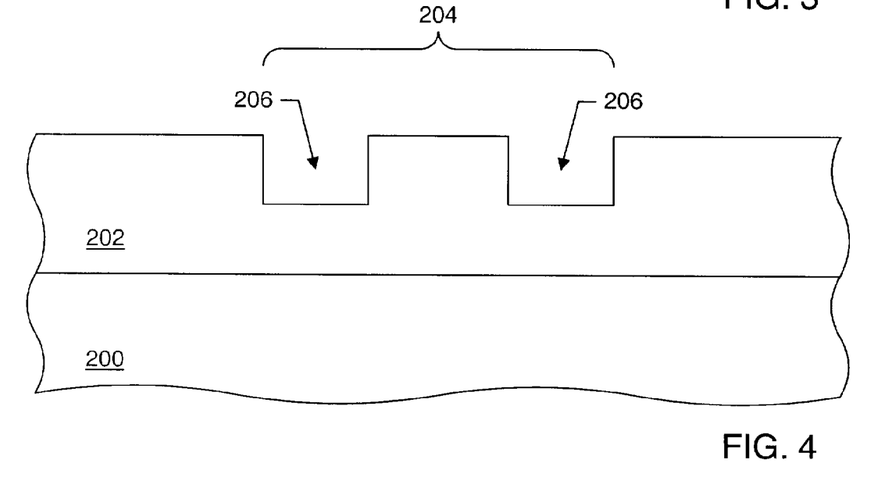
FIG. 4 is a partial cross-sectional view of the semiconductor topography, wherein source/drain trenches are patterned in the dielectric base layer according to a processing step subsequent to FIG. 3.

FIG. 4 shows a processing step in which source/drain trenches 206 are formed in dielectric base layer 202 within transistor area 204. (For the purpose of this disclosure, transistor area 204 refers to an area of the semiconductor topography in which a transistor is formed.) Source/drain trenches 206 may be formed by first depositing a layer of photoresist upon dielectric base layer 202 and subsequently exposing the photoresist through a mask. Openings in the photoresist are developed to expose select portions of the upper surface of dielectric base layer 206. An anisotropic etch technique may then be used to etch the exposed portions of dielectric base layer 206. The use of anisotropic etching allows the sidewalls of source/drain trenches 206 to be etched substantially vertically. Etching is preferably terminated before substrate 200 is reached so that the portions of dielectric base layer 202 beneath source/drain trenches 206 are capable of providing electrical insulation between the source/drain trenches and the underlying substrate. After etching is complete, the photoresist may be removed.

In a preferred embodiment, the depth of source/drain trenches 206 is about 1000–2000angstroms, and the distances between the bottoms of source/drain trenches 206 and the upper surface of substrate 200 is about 2000–5000 angstroms. Source/drain trenches 206 are preferably as wide as the minimum resolvable feature size of the photolithographic equipment used to pattern the overlying resist. In an embodiment, the source/drain trenches are each about 0.10–0.15 microns wide. In addition, source/drain trenches 206 are preferably separated from each other by about 0.10–0.15 microns.

Figure 5:
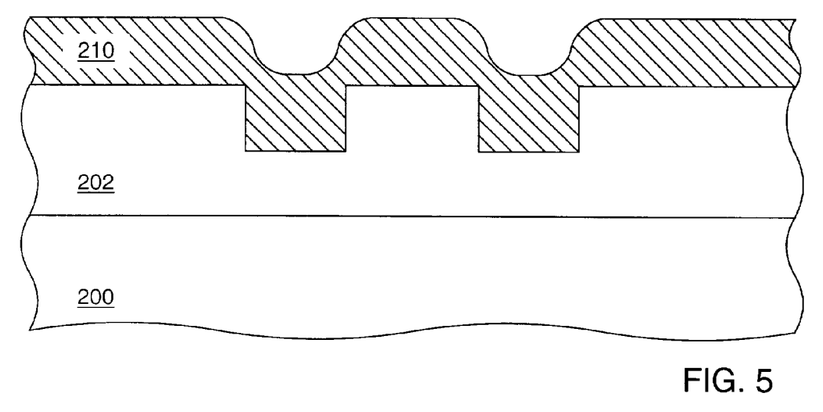
FIG. 5 is a partial cross-sectional view of the semiconductor topography, wherein a source/drain conductive layer is deposited according to a processing step subsequent to FIG. 4.

FIG. 5 depicts a processing step in which source/drain conductive layer 210 is deposited over dielectric base layer 202. Source/drain conductive layer is preferably deposited such that source/drain trenches 206 are substantially filled. Deposition of source/drain conductive layer 210 may involve depositing a low-resistivity metal such as copper or aluminum. In addition, high conductivity metal alloys may also be used. Copper may be particularly advantageous as a deposition material because of its extremely low resistivity and its compatibility with copper interconnect processes. In an embodiment, copper deposition may involve the formation of a thin seed layer of copper by physical vapor deposition ("PVD") techniques such as evaporation or sputtering, or by CVD. Deposition of thicker copper layers may follow using CVD, PVD, or plating techniques. Source/drain conductive layer 200 is preferably deposited between about 200–300° C.

Deposition of a source/drain conductive layer 210 that contains copper or other metals may also involve the prior deposition of an adhesion layer and/or a barrier layer.

Suitable adhesion/barrier layers include tantalum nitride and titanium nitride. These layers may be deposited by methods such as evaporation or sputtering.

Figure 6:
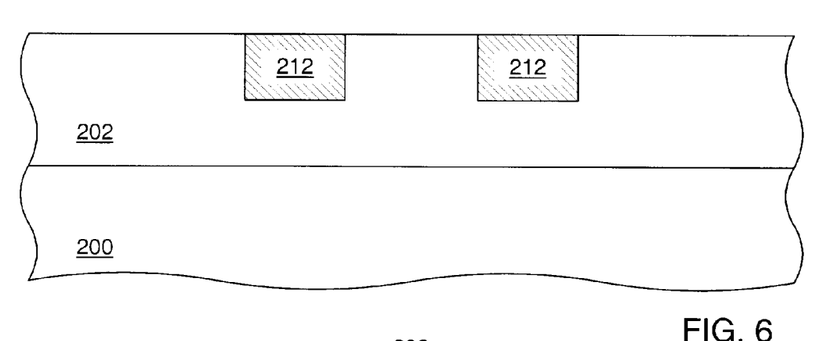
FIG. 6 is a partial cross-sectional view of the semiconductor topography, wherein portions of the source/drain conductive layer extending above the dielectric base layer are removed according to a processing step subsequent to FIG. 5.

FIG. 6 illustrates a processing step in which portions of source/drain conductive layer 210 extending above the upper surface of dielectric base layer 202 are removed. This removal is preferably performed using chemical-mechanical polishing ("CMP"). As a result of the removal process, source/drain structures 212 are formed that are substantially contained within source/drain trenches 206. The upper surfaces of source/drain structures 212 are preferably substantially level with the upper surface of dielectric base layer 202. Source/drain structures 212 are preferably each about 1000–2000angstroms thick. Preferably, both of source/drain structures 212 are capable of serving as a source or a drain depending on the desired transistor configuration.

Figure 7:
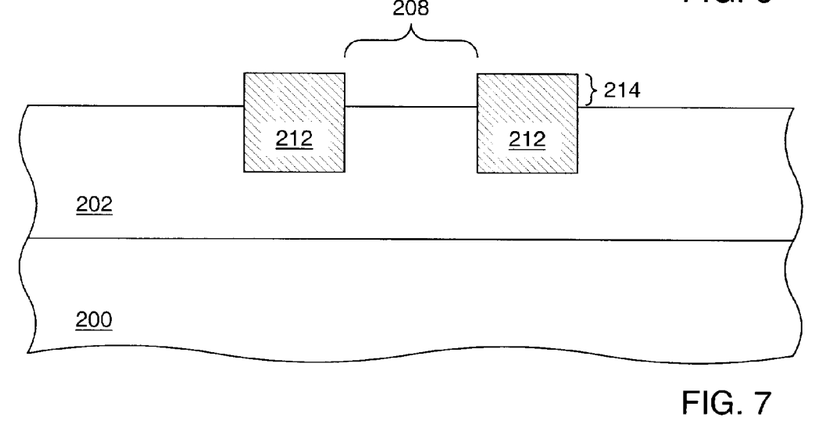
FIG. 7 is a partial cross-sectional view of the semiconductor topography, wherein the upper surface of the dielectric base layer is recessed according to a processing step subsequent to FIG. 6.

FIG. 7 depicts a processing step in which the upper surface of dielectric layer 202 is recessed a recession depth 214 below the upper surfaces of source/drain structures 212. Recession depth 214 is preferably about 500–1000 angstroms. Recession of the upper surface of dielectric base layer 202 is preferably carried out using an etch process that removes dielectric base layer 202 without removing substantial portions of source/drain structures 212. As shown in FIG. 7, gate trench 208 is defined between upper portions of source/drain structures 212 extending above the upper surface of dielectric base layer 206.

Figure 8:
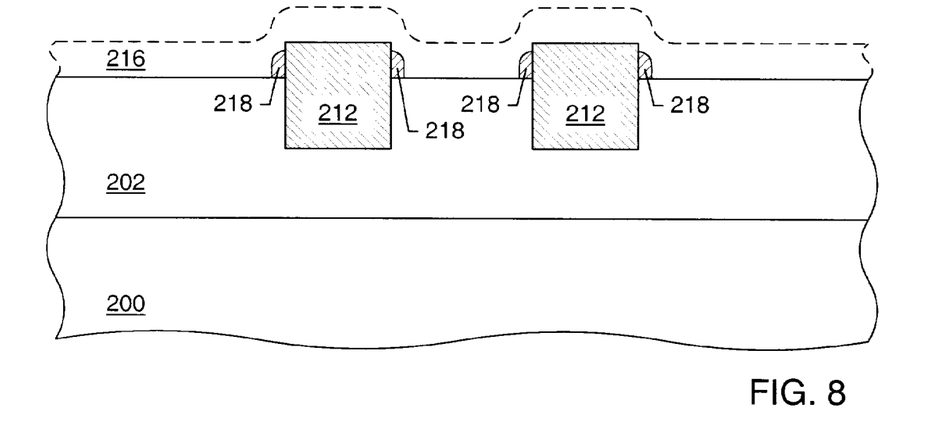
FIG. 8 is a partial cross-sectional view of the semiconductor topography, wherein dielectric spacers are formed on sidewall portions of the source/drain structures according to a processing step subsequent to FIG. 7.

FIG. 8 presents a processing step in which spacers 218 are formed on sidewall portions of source/drain structures 212. In forming spacers 218, a spacer dielectric layer 216 may first be CVD deposited across dielectric base layer 202 and source/drain structures 212. Spacer dielectric layer 216 may be composed of a suitable dielectric material, including silicon dioxide, silicon oxynitride, and silicon nitride. An anisotropic etch in which ion ablation occurs more rapidly upon horizontal surfaces than upon vertical surfaces may be performed to remove portions of spacer dielectric layer 216 such that spacers 218 are formed on sidewall portions of source/drain structures 218. Spacers 218 are preferably about 100–300 angstroms thick. The etch process to form spacers 218 may be continued past the point where the uppermost surfaces of spacers 218 are about level with the upper surfaces of source/drain structures 212. Preferably, etching is continued until the upper surfaces of spacers 218 are about 100–200 angstroms below the upper surfaces of source/drain structures 212. This "over-etching" of spacers 218 preferably ensures that the subsequently deposited conductive channel layer is at least in contact with upper sidewall portions of source/drain structures 212. (As described herein, "upper sidewall portions" of source/drain structures 212 are intended to refer to sidewall portions of the source/drain structures above the surface of the dielectric base layer and preferably adjacent to the top of the source/drain structures.)

In order to improve etch selectivity between spacer dielectric layer 216 and dielectric base layer 202, the two layers are preferably formed of substantially different dielectric materials. For example, dielectric base layer 202 could be composed of silicon dioxide, and spacer dielectric layer 216 could be composed of silicon nitride.

Figure 9:
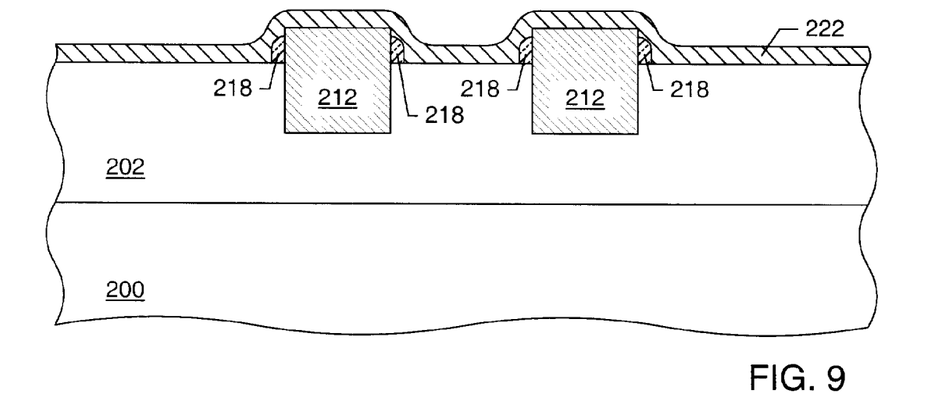
FIG. 9 is a partial cross-sectional view of the semiconductor topography, wherein a conductive channel layer is deposited according to a processing step subsequent to FIG. 8.

FIG. 9 depicts a processing step in which conductive channel layer 222 is formed above source/drain structures 212 and at least partially within gate trench 208. Conductive channel layer 222 may be composed of numerous conductive or potentially conductive materials including polysilicon and metals such as copper and aluminum. In a preferred embodiment, conductive channel layer 222 is composed of polysilicon and is CVD deposited from a silane source. After deposition, conductive layer 222 is preferably 100–400 angstroms thick. Depending on the bias voltage applied to an ensuing gate conductor, conductive channel layer 222 serves to selectively present a conductive path or "channel" between source/drain structures 212.

Figure 10:
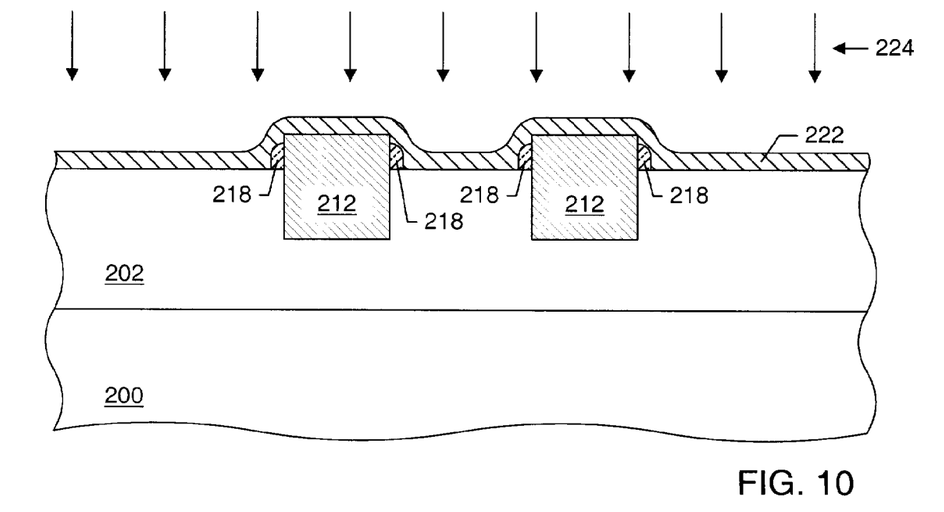
FIG. 10 is a partial cross-sectional view of the semiconductor topography, wherein dopants are introduced into the conductive channel layer according to a processing step subsequent to FIG. 9.

FIG. 10 presents a processing step in which dopants 224 are introduced into conductive channel layer 222. The introduction of dopants 224 is preferably performed using ion implantation. The implantation step depicted in FIG. 10 is preferably performed as a threshold voltage adjust implant. Threshold adjust dopants are typically p-type in n-channel transistors, and vice versa.

After the implantation step depicted in FIG. 10, an annealing step may be performed. The anneal may be used to activate implanted impurities, as well as to repair implant damage. Annealing is preferably performed between 550–700° C. The conditions of annealing may be sufficient to induce the migration of metal atoms from source/drain structures 212 into a conductive channel layer 222 composed of polysilicon and subsequently cause the formation of silicide in portions of the conductive channel layer. Such silicide formation may improve the contact resistance between conductive channel layer 222 and source/drain structures 212.

Figure 11:
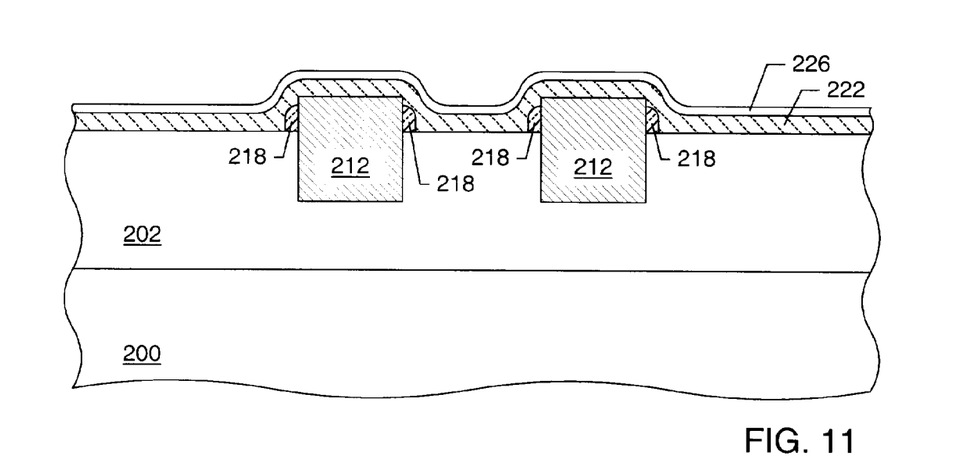
FIG. 11 is a partial cross-sectional view of the semiconductor topography, wherein a gate dielectric layer is formed upon the conductive channel layer according to a processing step subsequent to FIG. 10.

FIG. 11 illustrates a processing step in which gate dielectric layer 226 is formed above conductive channel layer 222 and at least partially within gate trench 208. Gate dielectric layer may be grown or deposited. Suitable materials for gate dielectric layer 226 include silicon dioxide and silicon oxynitride, as well as high k (i.e., k value greater than 4.0) materials such as silicon nitride and certain metal oxides (e.g., tantalum pentoxide).

Figure 12:
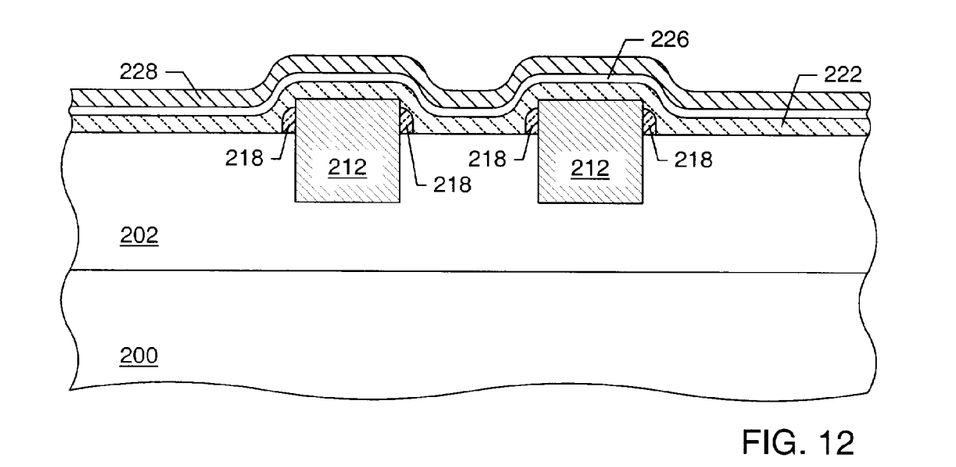
FIG. 12 is a partial cross-sectional view of the semiconductor topography, wherein a gate conductive layer is formed upon the gate dielectric layer according to a processing step subsequent to FIG. 11.

FIG. 12 depicts a processing step in which gate conductive layer 228 is formed upon gate dielectric layer 226 and at least partially within gate trench 208. Gate conductive layer 228 may be composed of various conductive or potentially conductive materials including metals and polysilicon. Preferred metals for gate conductive layer 228 are copper or aluminum. After deposition, gate conductive layer may be about 400–600angstroms 226 thick.

Figure 13:
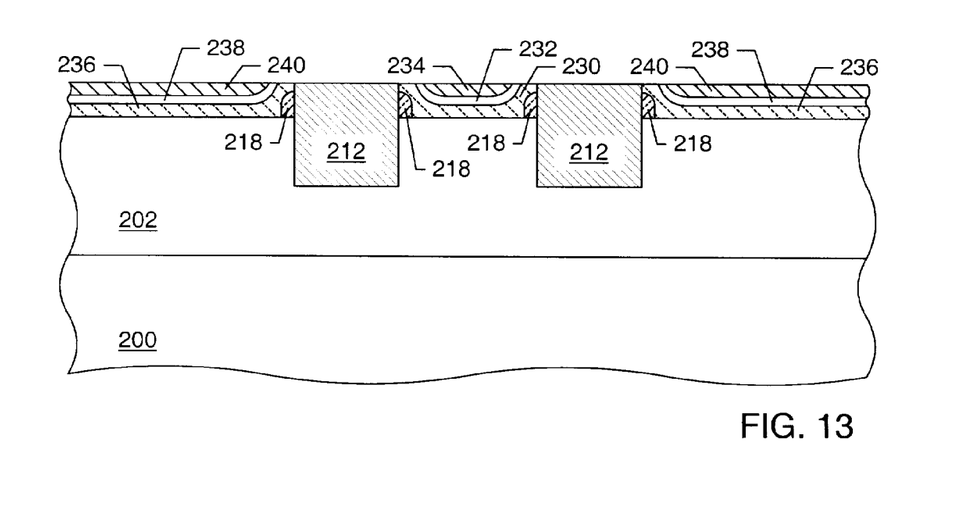
FIG. 13 is a partial cross-sectional view of the semiconductor topography, wherein the semiconductor topography is planarized according to a processing step subsequent to FIG. 12.

FIG. 13 depicts a processing step in which portions of the semiconductor topography are planarized. In an embodiment, portions of gate conductive layer 228, gate dielectric layer 226, and conductive channel layer 222 are planarized until portions of the layers laterally between the source/drain structures become unconnected to portions of the layers outside of transistor area 204. As a result of such planarization, gate conductor 234, gate dielectric 232, and conductive channel 230 are preferably formed within gate trench 208 and external conductive layer portions 236, external dielectric layer portions 238, and external conductive layer portions 240 are preferably formed outside of transistor area 204. Gate conductor 234, gate dielectric 232, and conductive channel 230 may be considered to be formed when they are separated by planarization or other techniques from the respective portions of gate conductive layer 228, gate dielectric layer 226, and channel conductive layer 222 that exist outside of transistor area 204.

The upper surface of gate conductor 234 is preferably level with the upper surfaces of source/drain structures 212. Conductive channel 230 is preferably in contact with upper sidewall portions of source/drain structures 212 and is at least partially arranged upon those of spacers 218 within gate trench 208. Gate dielectric 232 is preferably interposed between gate conductor 234 and conductive channel 230. At least a portion of gate dielectric 232 is preferably interposed between the upper sidewall portions of source/drain structures 212 and gate conductor 234. Portions of external conductive layer portions 236, external dielectric layer portions 238, and external conductive layer portions 240 may be removed and filled with an isolating dielectric material in subsequent processing to ensure electrical separation between the transistor formed within transistor area 202 and any other devices formed above dielectric base layer 202.

Figure 14:
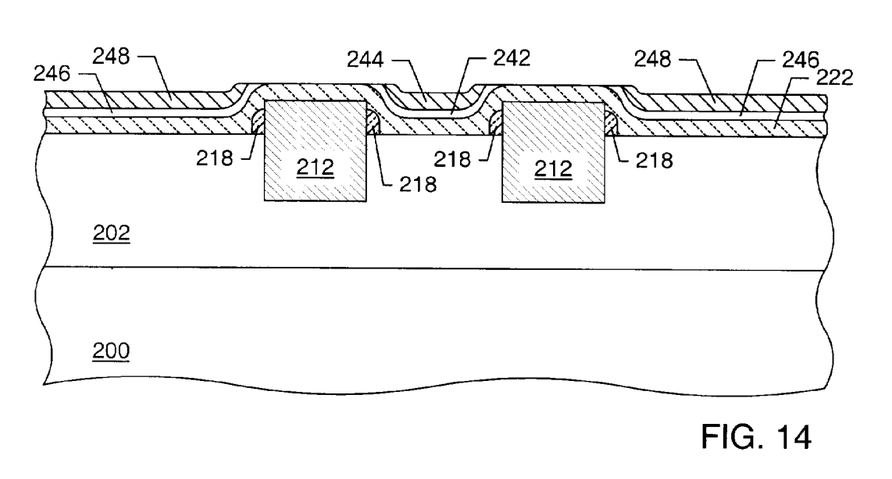
FIG. 14 is a partial cross-sectional view of the semiconductor topography in another embodiment, wherein the semiconductor topography is planarized according to a processing step subsequent to FIG. 12.

FIGS. 14–17 illustrate an embodiment in which silicide layers are formed upon source/drain structures 212. In this embodiment, conductive layer 222 is preferably composed of polysilicon. FIG. 14 depicts a processing step in which the semiconductor topography is planarized according to another embodiment subsequent to the processing step depicted in FIG. 12. Portions of gate conductive layer 228 and gate dielectric layer 226 may be planarized such that gate conductor 244 and gate dielectric 246 are formed at least partially within gate trench 208 and external conductive layer portion 248 and external dielectric layer portions 246 are formed outside of transistor area204. Such planarization preferably leaves at least a portion of channel conductive layer 222 intact above source/drain structures 212.

Figure 15:
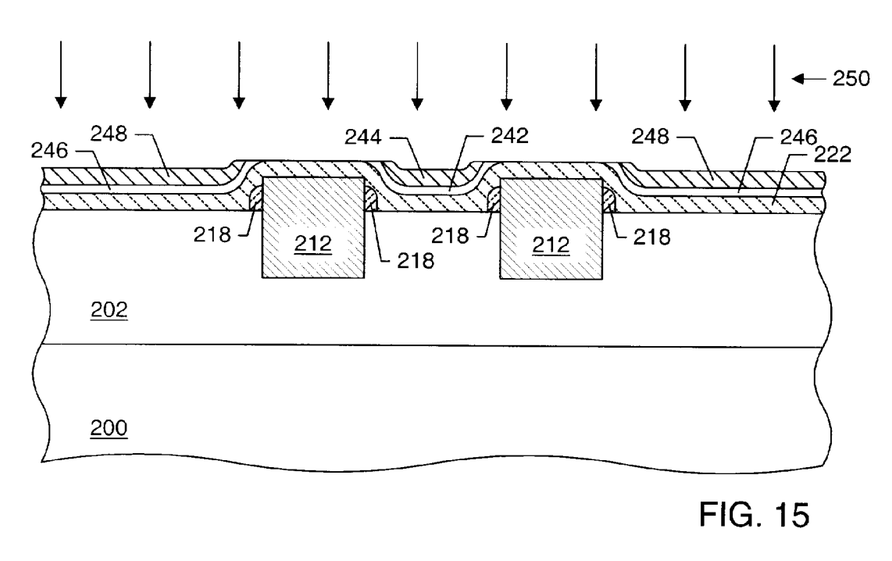
FIG. 15 is a partial cross-sectional view of the semiconductor topography, wherein dopants are implanted into exposed portions of the conductive channel layer according to a processing step subsequent to FIG. 14.

FIG. 15 is a partial cross-sectional view of the semiconductor topography, wherein dopants are implanted into exposed portions of conductive channel layer 222. Such a dopant implantation step is optional and may be used to lower the necessary anneal temperature during subsequent salicide formation.

Figure 16:
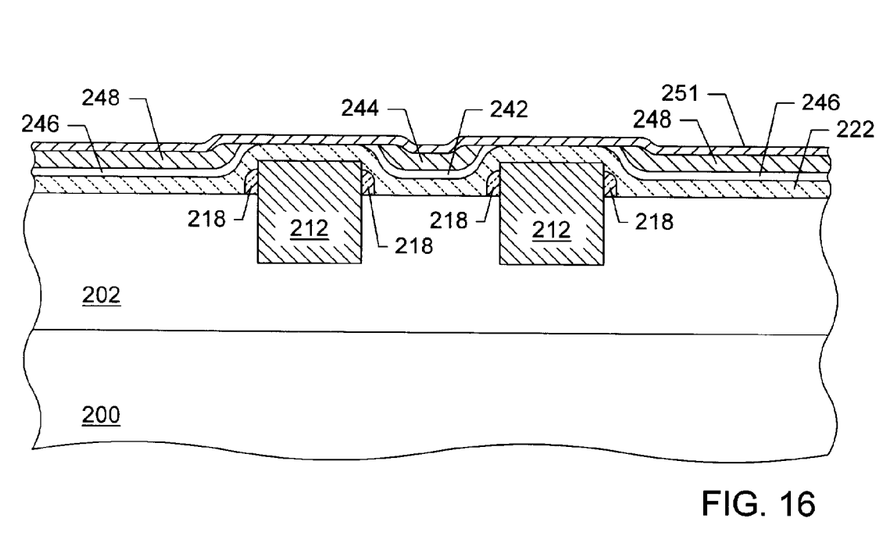
FIG. 16 is a partial cross-sectional view of the semiconductor topography, wherein a metal layer is deposited upon the exposed portions of the conductive channel layer according to a processing step subsequent to FIG. 15.

FIG. 16 presents a processing step in which metal layer 251 is deposited over the semiconductor topography such that the metal layer is in contact with the exposed portions of conductive channel layer 222. Metal layer 251 may be composed of any metal suitable for the formation of a quality silicide. In a preferred embodiment, metal layer 251 is composed of cobalt. Metal layer 251 is preferably deposited at a thickness sufficient to completely silicide the exposed portions of conductive channel layer 222 above source/drain structures 212.

Figure 17:
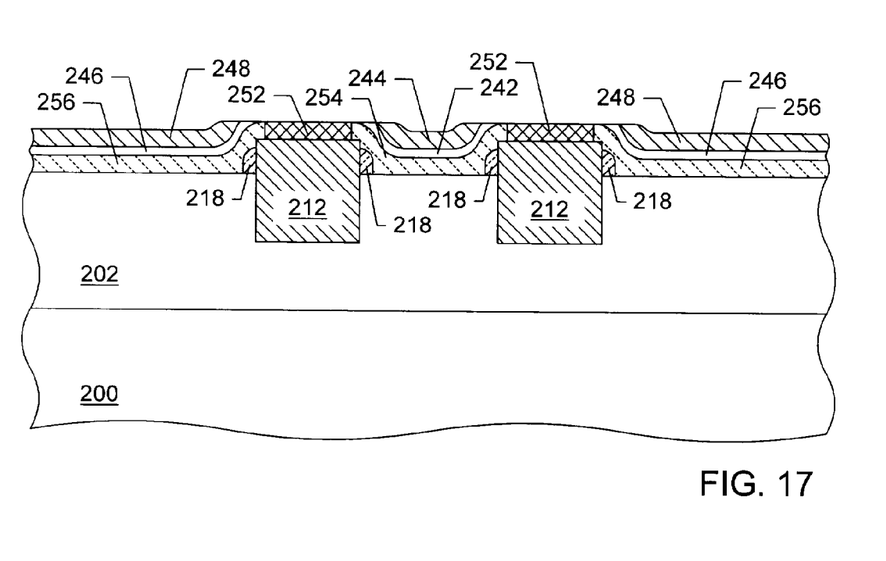
FIG. 17 is a partial cross-sectional view of the semiconductor topography, wherein the exposed portions of the channel conductive layer are silicided and the unreacted portions of the metal layer are removed according to a processing step subsequent to FIG. 16.

FIG. 17 depicts a processing step in which silicide layers 252 are formed above source/drain structures 212 and unreacted portions of metal layer 251 are removed. Silicidation preferably occurs in an annealing process in which metal atoms from metal layer 251 diffuse into and react with silicon atoms within the conductive channel layer to form silicide. The anneal performed for silicidation may also serve to activate dopants and repair implant damage from previous processing. In addition, the annealing may cause silicidation within portions of conductive channel layer 222 in contact with source/drain structures 212 and within gate trench 208. If gate conductor 244 is composed of polysilicon, than a portion of the gate conductor may be silicided during this step. In such a case, it is preferred that gate conductor 244 be substantially thicker than the portions of conductive channel layer above source/drain structures 212 prior to annealing. The formation of silicide layers 252 divides conductive channel layer 222 into conductive channel 254 and external conductive layer 256. After the silicidation process, is complete, processing may proceed as described above in relation to FIG. 13.

It will be appreciated to those skilled in the art having the benefit of this disclosure that this invention is believed to provide a method for fabricating an integrated circuit containing an improved transistor having low-resistivity source/drain structures, and an integrated circuit containing such an improved transistor. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit, comprising:

a pair of source/drain regions comprising metal spaced from each other and extending partially within and upon a dielectric layer;

a conductive channel layer extending upon said dielectric layer between said pair of source/drain regions; and a gate conductor dielectrically spaced above the conductive channel layer.

2. The integrated circuit of claim 1, wherein said pair of source/drain regions comprise copper.

3. The integrated circuit of claim 1, wherein said gate conductor is at least partially defined within a gate trench formed above the dielectric layer between an upper portion of the pair of source/drain regions that extends above the dielectric layer.

4. The integrated circuit of claim 3, further comprising a gate dielectric at least partially arranged within said gate trench, wherein said gate dielectric is interposed between said gate conductor and said conductive channel layer.

5. The integrated circuit of claim 4, wherein a portion of the gate dielectric is interposed between an upper sidewall portion of one of said pair of source/drain regions and said gate conductor.

6. The integrated circuit of claim 1, wherein an upper surface of said gate conductor is substantially planar with upper surfaces of said pair of source/drain regions.

7. The integrated circuit of claim 1, wherein said conductive channel layer is in contact with portions of said pair of source/drain regions which protrude above the dielectric layer.

8. The integrated circuit of claim 1, wherein spacers are arranged on sidewall portions of said pair of source/drain regions, and wherein said conductive channel layer is at least partially arranged above said spacers and contacts sections of said sidewall portions elevationally above said spacers.

9. The integrated circuit of claim 8, wherein said dielectric layer comprises a first dielectric material, and wherein said spacers comprise a second dielectric material, and wherein said first dielectric material is substantially different than said second dielectric material.

10. The integrated circuit of claim 1, wherein said conductive channel layer comprises silicide.

11. The integrated circuit of claim 1, wherein a silicide layer is arranged above each of said pair of source/drain regions.

12. The integrated circuit of claim 1, wherein said dielectric layer comprises a dielectric material having a dielectric constant (k) less than about 3.5.

13. The integrated circuit of claim 1, wherein said source/drain regions consist essentially of metal.

\* \* \* \* \*